United States Patent
Yang et al.

(10) Patent No.: US 9,818,980 B2
(45) Date of Patent: Nov. 14, 2017

(54) ORGANIC LIGHT EMITTING DIODE DISPLAY

(71) Applicant: AU Optronics Corporation, Hsin-Chu (TW)

(72) Inventors: Chieh-Hung Yang, Hsin-Chu (TW); Ju-Cheng Hsiao, Hsin-Chu (TW); Meng-Ting Lee, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/064,778

(22) Filed: Mar. 9, 2016

(65) Prior Publication Data

US 2017/0005289 A1   Jan. 5, 2017

(30) Foreign Application Priority Data

Jul. 2, 2015 (TW) .............................. 104121509 A

(51) Int. Cl.

| H01L 29/08 | (2006.01) |
|---|---|
| H01L 51/52 | (2006.01) |
| H01L 29/49 | (2006.01) |
| H01L 51/50 | (2006.01) |
| H01L 51/05 | (2006.01) |
| H01L 51/00 | (2006.01) |
| H01L 29/66 | (2006.01) |
| H01L 33/48 | (2010.01) |
| H01L 25/075 | (2006.01) |

(52) U.S. Cl.
CPC ...... H01L 51/5256 (2013.01); H01L 51/5253 (2013.01); *H01L 25/0753* (2013.01); *H01L 29/4908* (2013.01); *H01L 29/66765* (2013.01); *H01L 33/486* (2013.01); *H01L 51/0036* (2013.01); *H01L 51/0541* (2013.01); *H01L 51/5012* (2013.01)

(58) Field of Classification Search
CPC ... H01L 51/5253; H01L 33/486; H01L 33/62; H01L 33/54; H01L 25/0753; H01L 33/26
USPC .............. 257/40, 98, 100, 103, 787, E33.06, 257/E33.059; 438/82, 99, 22, 26, 27, 112
See application file for complete search history.

(56) References Cited

U.S. PATENT DOCUMENTS

| 6,160,663 | A | 12/2000 | Merrill et al. |
| 8,735,936 | B2 * | 5/2014 | Kim .................. H01L 51/5256 |
| | | | 313/512 |
| 2006/0002139 | A1 | 1/2006 | Chen et al. |
| 2006/0088951 | A1 | 4/2006 | Hayashi et al. |
| 2008/0298068 | A1 | 12/2008 | Chen et al. |

(Continued)

FOREIGN PATENT DOCUMENTS

| CN | 2845399 Y | 12/2006 |
| CN | 103759227 A | 4/2014 |

(Continued)

*Primary Examiner* — Thinh T Nguyen
(74) *Attorney, Agent, or Firm* — WPAT, PC

(57) ABSTRACT

An organic light emitting diode (OLED) display includes a substrate, an organic light emitting diode, and a first barrier layer. The organic light emitting diode is disposed on the substrate, in which the projection of the organic light emitting diode on the substrate has a first profile. The first barrier layer is disposed on the organic light emitting diode, in which the projection of the first barrier layer on the substrate has a second profile. The first profile is non-conformal with the second profile.

18 Claims, 8 Drawing Sheets

(56) References Cited

U.S. PATENT DOCUMENTS

| | | | |
|---|---|---|---|
| 2010/0045175 A1* | 2/2010 | Mathai | H01L 27/3209 313/504 |
| 2010/0117523 A1* | 5/2010 | Tchakarov | H01L 51/5215 313/504 |
| 2014/0062301 A1 | 3/2014 | Sung | |
| 2016/0133805 A1* | 5/2016 | Park | H01L 33/58 438/15 |

FOREIGN PATENT DOCUMENTS

| | | |
|---|---|---|
| JP | 2011-146323 A | 7/2011 |
| TW | 201411902 A | 3/2014 |

\* cited by examiner

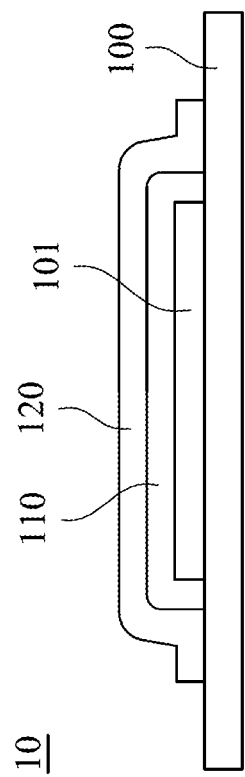
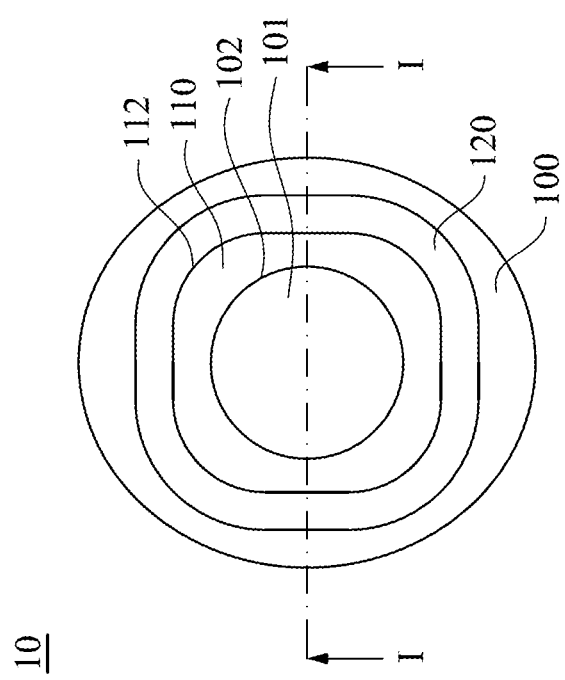
Fig. 3B
Fig. 3A

ORGANIC LIGHT EMITTING DIODE DISPLAY

RELATED APPLICATIONS

This application claims priority to Taiwan Application Serial Number 104121509, filed Jul. 2, 2015, which is herein incorporated by reference.

BACKGROUND

Field of Disclosure

The present disclosure relates to an organic light emitting diode display.

Description of Related Art

With the successful development of organic material, the organic light emitting diode display (OLED) becomes an attraction in the display market recently. Because the electroluminescent component is made of an organic material in OLED, the electroluminescent component is very sensitive to moisture. When the water vapor permeates the organic electroluminescent component, it may induce some defects and affect display quality and the product life seriously. Accordingly, with the development of OLED, the package material for OLED needs not only good abrasion resistance and high thermal conductivity, but also good isolation character from moisture and water vapor. Because of effective isolation from moisture and water vapor, the life of product is increased.

In the package construction of OLED, an organic layer is usually utilized to cover the display area so that OLED is protected. The organic layer is coated on the substrate by spin coating. Then, it is patterned to a specific profile through lithography process. However, in conventional technology, it is difficult to avoid a misalignment between the substrate and the mask aligner. In order to avoid the organic layer covering OLED incompletely owing to the misalignment, the boundary of the organic layer is designed to extend from that of OLED by maximum distance of misalignment. Therefore, it is hard to miniature the size of OLED after packaging. Unfortunately, it is against the trend of product miniaturization.

SUMMARY

The disclosure provides an organic light emitting diode display (OLED) to improve the issues above for the conventional technology.

One of the embodiments of this disclosure provides an OLED including a substrate, an organic light emitting diode and a first barrier layer. The organic light emitting diode is disposed on the substrate and the orthogonal projection of the organic light emitting diode on the substrate has a first profile. The first barrier layer is disposed on the organic light emitting diode. The orthogonal projection area of the first barrier layer is lager than that of the organic light emitting diode on the substrate. The orthogonal projection of the first barrier layer on the substrate has the second profile. The first profile and the second profile are not conformal.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 3A is a partial enlarged top view of the organic light emitting diode display according to a second embodiment of this disclosure;

FIG. 3B is a cross-sectional view along the line I-I in FIG. 3A;

DESCRIPTION OF THE EMBODIMENTS

Figure 1B:
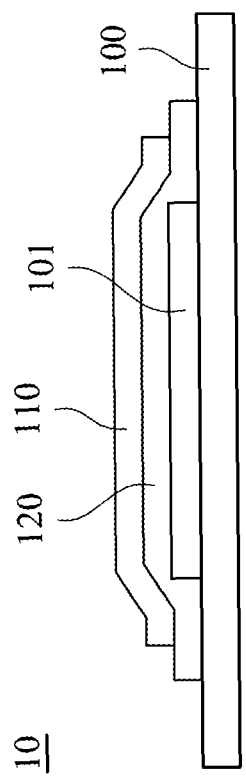
FIG. 1B is a cross-sectional view along the line I-I in FIG. 1A.

Reference will now be made in detail to the present embodiments of the disclosure, examples of which are illustrated in the accompanying drawings. Wherever possible, the same reference numbers are used in the drawings and the description to refer to the same or like parts. In order to clarify this disclosure, some details in practice may be described as below. However, it should be understood that the details should not limit this disclosure. In other words, some detailed components in some embodiments may be omitted or ignored. Furthermore, in order to simplify the drawings, some conventional structures or components may be drawn in simple schematic forms.

Figure 1A:
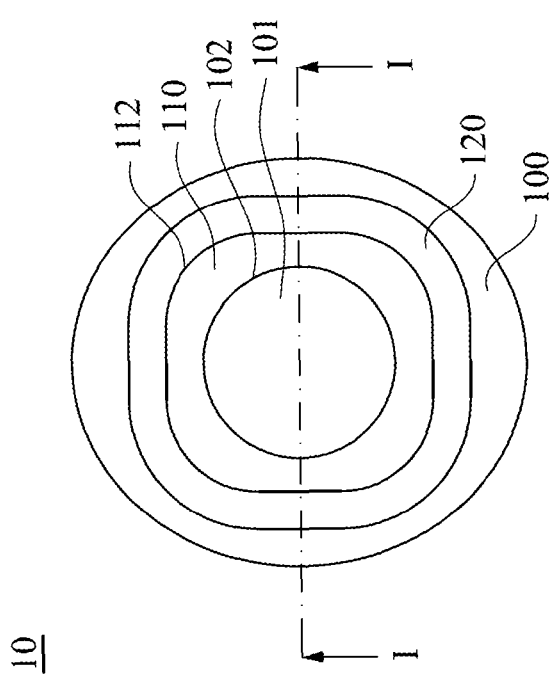
FIG. 1A is a partial enlarged top view of the organic light emitting diode display according to a first embodiment of this disclosure.

FIG. 1A is a partial enlarged top view of the organic light emitting diode display according to a first embodiment of this disclosure. FIG. 1B is a cross-sectional view along the line I-I in FIG. 1A. The organic light emitting diode display 10 includes the substrate 100, an organic light emitting diode 101 disposed on the substrate 100 and at least one barrier layer disposed on the organic light emitting diode 101. Because the organic light emitting diode 101 is very sensitive to moisture, it is easy to induce defects when moisture permeates the organic light emitting diode 101. Accordingly, at least one barrier layer is disposed to cover the organic light emitting diode 101 to protect the organic light emitting diode 101.

In this embodiment, the barrier layers include the first barrier layer 110 disposed on the organic light emitting diode 101 and the second barrier layer 120 disposed between the first barrier layer 110 and the organic light emitting diode 101. The first barrier layer 110 is made of an organic material, for example, acrylic polymer. The second barrier layer 120 is made of an inorganic material, for example, silicon nitride, silicon oxide, silicon oxynitride, or the composition thereof. The second barrier layer 120 is utilized to prevent the organic light emitting diode 101 from being damaged by solvents in the organic layer, for example, the first barrier layer 110.

The orthogonal projection area of the first barrier layer 110 is larger than that of the organic light emitting diode 101 on the substrate 100. The orthogonal projection area of the second barrier layer 120 is larger than that of the first barrier layer 110 on the substrate 100. The first barrier layer 110 may be disposed on the second barrier layer 120 directly or indirectly. In some embodiments, the first barrier layer 110 may contact the second barrier layer 120 directly. In some other embodiments, other organic or inorganic layer may be disposed between the first barrier layer 110 and the second barrier layer 120. The second barrier layer 120 may be disposed on the organic light emitting diode 101 directly or indirectly. In some embodiments, the second barrier layer 120 may contact the organic light emitting diode 101 directly. In some other embodiments, other organic or inorganic layer may be disposed between the second barrier layer 120 and the organic light emitting diode 101.

In order to solve the issue of the organic layer covering the organic light emitting diode incompletely owing to misalignment in conventional fabricating process, in this embodiment, the profile of the first barrier layer 110 and that of the organic light emitting diode are designed to be non-conformal so that the area of the first barrier layer 110 may be reduced. Moreover, the first barrier layer 110 can cover the organic light emitting diode completely even though the misalignment is raised.

In practice, the orthogonal projection of the organic light emitting diode 101 on the substrate 100 has a first profile 102. For example, the first profile 102 of the organic light emitting diode 101 is similar to a circle according to this embodiment. In other embodiments, the first profile 102 may be any other geometric shape. The orthogonal projection of the first barrier layer 110 on the substrate 100 has a second profile 112. The first profile 102 and the second profile 112 are not conformal shapes, for example, the second profile 112 is not a circle, so that the distance between the first profile 102 and the second profile 112 is reduced. Further, when the misalignment is maximal, the first profile 102 will not extend out of the second profile 112. Accordingly, the organic light emitting diode 101 is protected, meanwhile the size of the organic light emitting diode display 10 is reduced.

Figure 2A:
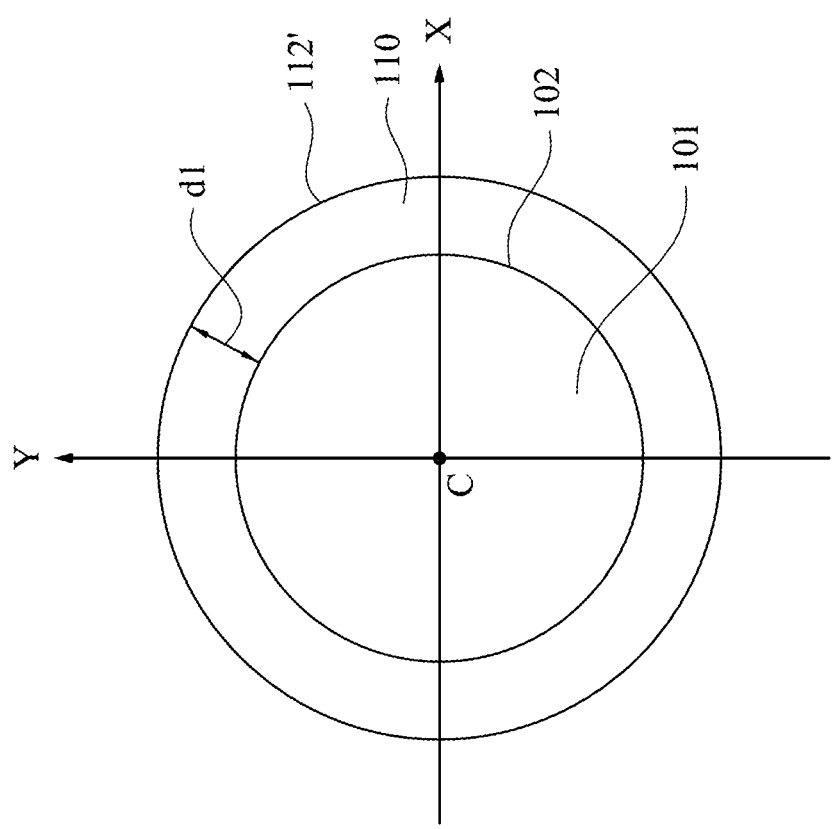
FIG. 2A is a top view of an organic light emitting diode with a conformal first barrier layer.
Figure 2B:
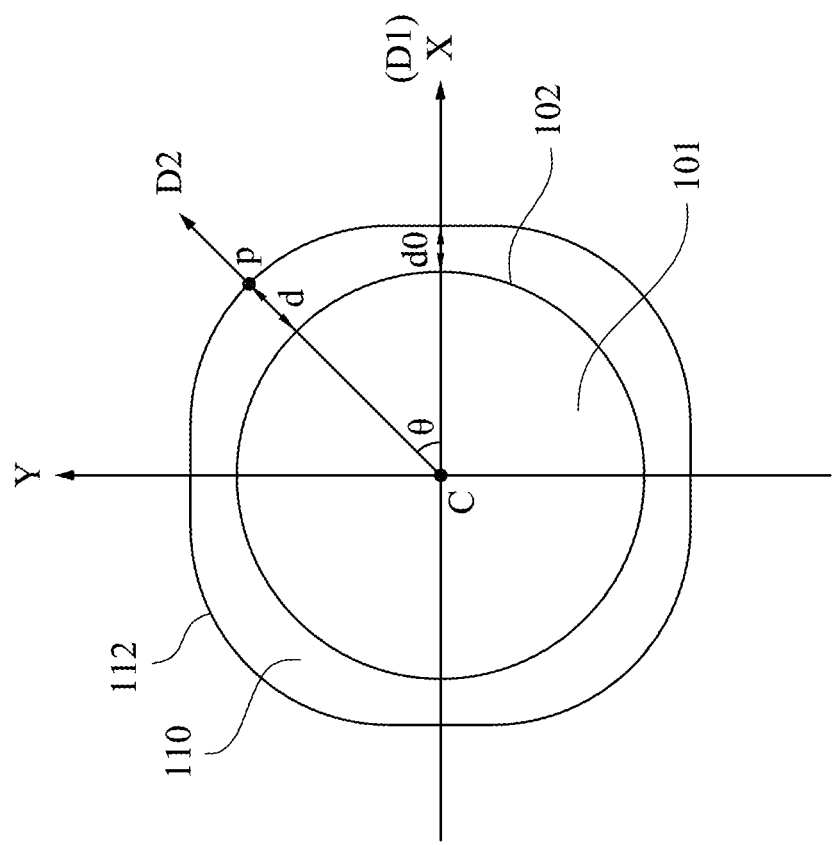
FIG. 2B is a top view of an organic light emitting diode with a non-conformal first barrier layer.

Referring to FIG. 2A and FIG. 2B, FIG. 2A is a top view of the organic light emitting diode 101 and the first barrier layer 110, which are conformal shapes; FIG. 2B is a top view of the organic light emitting diode 101 and the first barrier layer 110, which are non-conformal shapes. From these two drawings, it is explained how the non-conformal profiles of the first barrier layer 110 and the organic light emitting diode is designed. Accordingly, the first barrier layer 110 can cover the organic light emitting diode thereunder completely even the size thereof is reduced.

The first profile 102 of the organic light emitting diode 101 has the geometric center C. For example, when the first profile 102 is circular, the center of the circle coincides with the geometric center of the first profile 102. Then, the geometric center C is regarded as the origin, and an X-axis and a Y-axis are defined. The X-axis and Y-axis correspond to the coordinate axes of the mask aligner of a photolithography machine. The misalignment tolerance between the substrate and the mask aligner is along X-axis direction and/or Y-axis direction. In other words, when the misalignment tolerance along X-axis (or Y-axis) is zero, in positive direction or in negative direction. When neither the misalignment tolerance along X-axis nor that along Y-axis is not equal to zero, the resultant tolerance is greater than both of them. Therefore, the maximal misalignment tolerance will be raised at an angle of 45 degrees.

For example, the maximal misalignment tolerance between the substrate and the mask aligner (along X-axis or Y-axis) is $\Delta$. As shown in FIG. 2A, the second profile 112' and the first profile 102 are conformal shape so that the distance d1 between the second profile 112' and the first profile 102 is constant in any direction toward the origin. The distance d1 must be greater than or equal to $(\sqrt{2})*\Delta$ to ensure that the first profile 102 will not extend out of the second profile even the maximal resultant tolerance is happened (that is, at an angle of about 45 degrees).

As shown in FIG. 2B, the second profile 112 and the first profile 102 are non-conformal shapes according to this embodiment. The distance d between the second profile 112 and the first profile 102 must be greater than or equal to $(\sqrt{2})*\Delta$ at an angle of about 45 degrees, however, the distance at any other position may be less than $(\sqrt{2})*\Delta$. The distance d0 between the second profile 112 and the first profile 102 may be very closed to $\Delta$ along X-axis or Y-axis. Therefore, the area of the first barrier layer 110 is reduced effectively; meanwhile the size of the organic light emitting diode display is shrunk.

Referring to FIG. 2B, the direction passing through the geometric center C is defined as the first direction D1. According to this embodiment, the first direction D1 is substantially parallel with the X-axis. The connecting line between a position P of the second profile 112 and the geometric center C is defined as the second direction D2. An included angle between the first direction D1 and the second direction D2 is $\theta$. When the angle $\theta$ is about zero degree or about 90 degrees (that is, the second direction D2 and the first direction D1 are in the same direction or mutually perpendicular), the distance between the first profile 102 and the second profile 112 at position P has a relative minimum value d0. The distance d0 may be greater than or equal to $\Delta$. When the angle $\theta$ is not zero degree nor 90 degrees, for example, about 15 degrees, 30 degrees, 45 degrees, 60 degrees, 75 degrees, the distance between the first profile 102 and the second profile 112 at position P must be greater than d0.

In some embodiments, when the included angle $\theta$ is between zero degree and 45 degrees, the distance d between the first profile 102 and the second profile 112 at position P substantially satisfies $d>d0*\sec(\theta)$. The distance d0 is between the first profile 102 and the second profile 112 at position P when the included angle $\theta$ is about zero degree. In other words, the distance d0 is the relative minimum value.

In some embodiments, when the included angle $\theta$ is between 45 degrees and 90 degrees, the distance d between the first profile 102 and the second profile 112 at position P substantially satisfies $d>d0*\sec(90°-\theta)$. The distance d0 is between the first profile 102 and the second profile 112 at position P when the included angle $\theta$ is about 90 degrees. In other words, the distance d0 is the relative minimum value.

To sum up, the non-conformal design of the first profile 102 of the organic light emitting diode 101 and the second profile 112 of the first barrier layer 110 has been described in the embodiments above. Accordingly, the area of the first barrier layer 110 is significantly reduced (especially comparing to the conventional conformal design). Some variations of the barrier layer on the organic light emitting diode 101 will be described in the embodiments below. The following description about some features which are the same as those of the first embodiment will be omitted.

Referring to FIG. 3A and FIG. 3B, FIG. 3A is a partial enlarged top view of the organic light emitting diode display according to a second embodiment of this disclosure; FIG. 3B is a cross-sectional view along the line I-I in FIG. 3A. The difference between this embodiment and the previous embodiment is that the organic first barrier layer 110 is disposed on the organic light emitting diode 101 and the inorganic second barrier layer 120 is disposed on the first barrier layer 110. The orthogonal projection area of the first barrier layer 110 is larger than that of the organic light emitting diode 101 on the substrate 100. The orthogonal projection area of the second barrier layer 120 is larger than that of the first barrier layer 110 on the substrate 100.

Figures 4A, 4B:
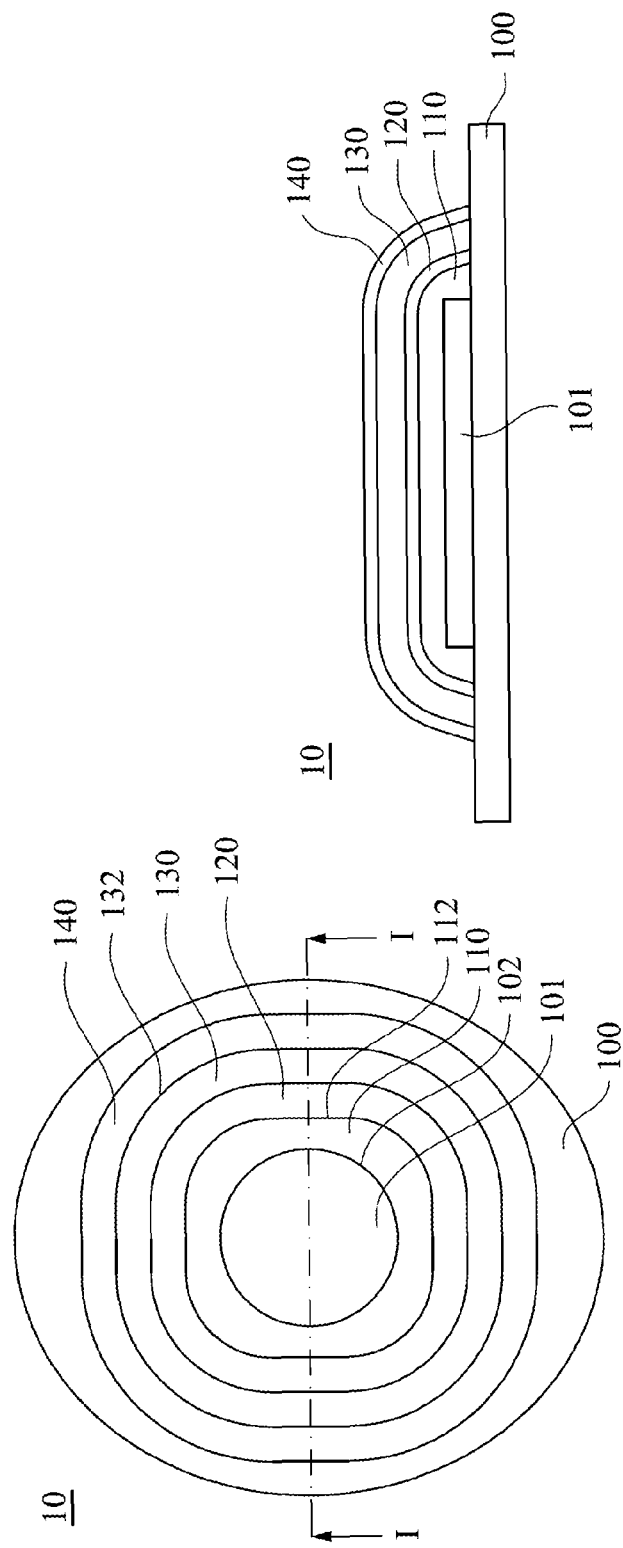
FIG. 4A is a partial enlarged top view of the organic light emitting diode display according to a third embodiment of this disclosure.
FIG. 4B is a cross-sectional view along the line I-I in FIG. 4A.

The first profile 102 of the organic light emitting diode 101 and the second profile 112 of the first barrier layer 110 are non-conformal shapes, while the profile of the second barrier layer 120 and the second profile 112 may be conformal shapes. Thus, the area of the barrier layer may be reduced. Similarly, the first barrier layer 110 may contact the second barrier layer 120 directly. Otherwise, there may be some other organic layers or inorganic layers between the first barrier layer 110 and the second barrier layer 120. As shown in FIG. 4A and FIG. 4B, in some embodiments, some other organic barrier layers may cover the first barrier layer 110.

Referring to FIG. 4A and FIG. 4B, FIG. 4A is a partial enlarged top view of the organic light emitting diode display according to a third embodiment of this disclosure; FIG. 4B is a cross-sectional view along the line I-I in FIG. 4A. The organic light emitting diode display 10 further includes a third barrier layer 130 disposed on the second barrier layer 120, and a fourth barrier layer 140 disposed on the third barrier layer 130. The third barrier 130 may be made of organic material. The fourth barrier layer may be made of inorganic material.

Figure 5:
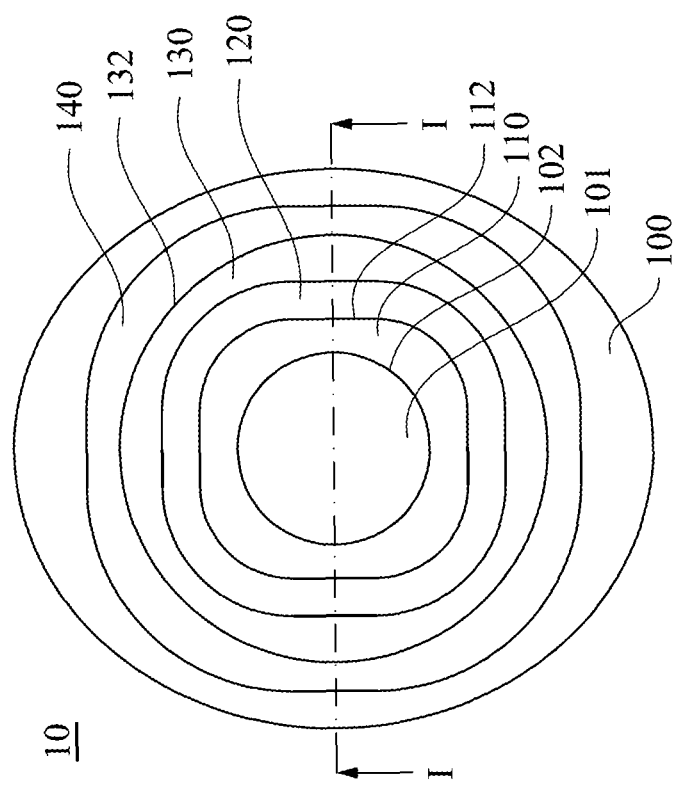
FIG. 5 is a partial enlarged top view of the organic light emitting diode display according to a fourth embodiment of this disclosure.

The orthogonal projection area of the third barrier layer 130 is larger than that of the first barrier layer 110 on the substrate 100. The orthogonal projection of the third barrier layer 130 on the substrate 100 has a third profile 132. The third profile 132 is non-conformal with the first profile 102 of the organic light emitting diode 101. As shown in this embodiment, the third profile 132 may be conformal with the second profile 112 of the first barrier layer 110. In other embodiment, for example, the fourth embodiment in FIG. 5, the third profile 132 may be conformal with the first profile 102, while the third profile 132 is non-conformal with the second profile 112.

The orthogonal projection area of the fourth barrier layer 140 is larger than that of the third barrier layer 130 on the substrate 100 so that the fourth barrier layer 140 covers the third barrier layer 130 completely to protect it. Further, the adhesion of the third barrier layer 130 is improved. The profile of the fourth barrier layer 140 may be conformal with the third profile 132 to reduce the area of the barrier layer.

Figure 6A:
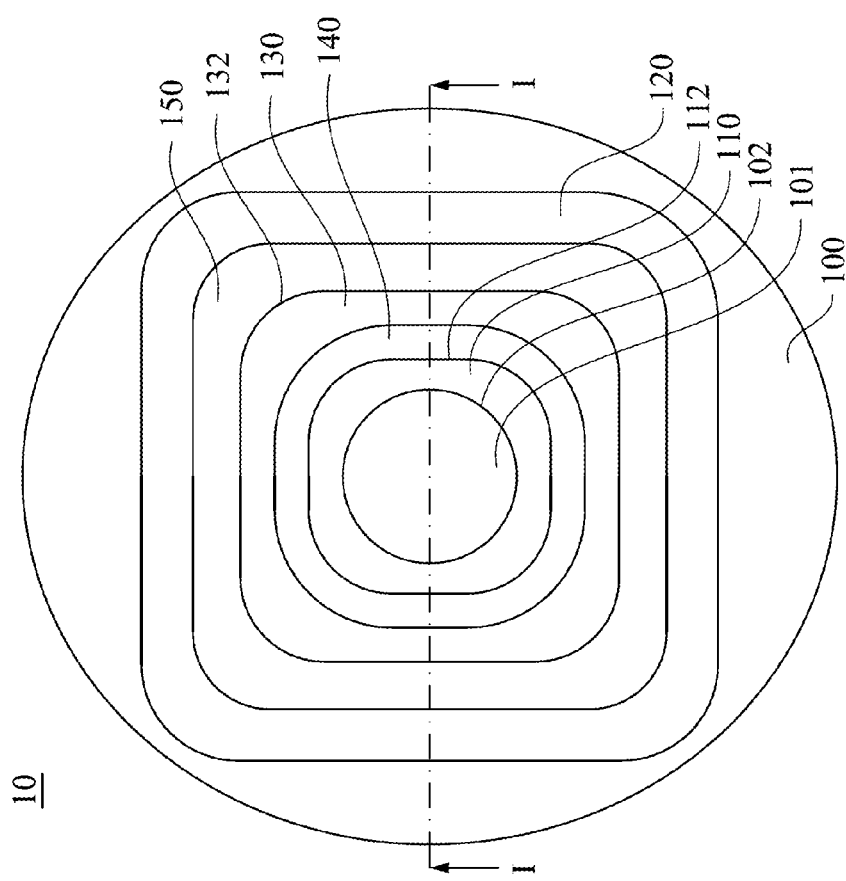
FIG. 6A is a partial enlarged top view of the organic light emitting diode display according to a fifth embodiment of this disclosure.
Figure 6B:
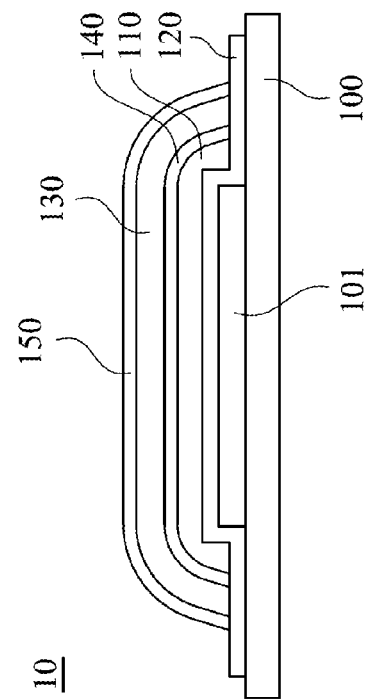
FIG. 6B is a cross-sectional view along the line I-I in FIG. 6A.

Referring to FIG. 6A and FIG. 6B, FIG. 6A is a partial enlarged top view of the organic light emitting diode display according to a fifth embodiment of this disclosure; and FIG. 6B is a cross-sectional view along the line I-I in FIG. 6A. In this embodiment, in addition to the organic first barrier layer 110 on the organic light emitting diode 101 and the inorganic second barrier layer 120 between the first barrier layer 110 and the organic light emitting diode 101, the barrier layers further include a organic third barrier layer 130 on the first barrier layer 110, and a fourth barrier layer 140 between the third barrier layer 130 and the first barrier layer 110.

Figure 7:
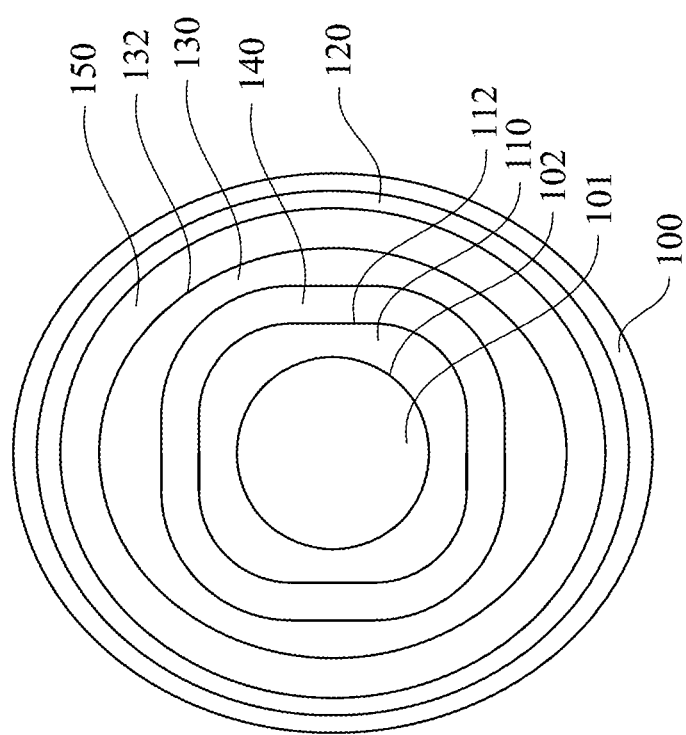
FIG. 7 is a partial enlarged top view of the organic light emitting diode display according to a sixth embodiment of this disclosure.

The orthogonal projection area of the third barrier layer 130 is larger than that of the first barrier layer 110 on the substrate 100. The orthogonal projection of the third barrier layer 130 on the substrate 100 has the third profile 132. The third profile 132 is non-conformal with the first profile 102 of the organic light emitting diode 101. As shown in this embodiment, the third profile 132 may be conformal with the second profile 112 of the first barrier layer 110. In other embodiment, for example, the sixth embodiment in FIG. 7, the third profile 132 may be non-conformal with the second profile 112, and the third profile 132 is non-conformal with the first profile 102.

The fourth barrier layer 140 may be made of inorganic material. The orthogonal projection area of the fourth barrier layer 140 is larger than that of the first barrier layer 110 on the substrate 100 so that the fourth barrier layer 140 covers the first barrier layer 110 completely. Therefore, the fourth barrier layer 140 prevents the first barrier layer 110 from being damaged during the fabricating process of the third barrier layer 130.

In some embodiments, a fifth barrier layer 150 is optionally disposed on the third barrier layer 130. The fifth barrier layer 150 may be made of inorganic material. The orthogonal projection area of the fifth barrier layer 150 is larger than that of the third barrier layer 130 on the substrate 100. The fifth barrier layer 150 further isolates the organic light emitting diode 101 from outside moisture.

In some embodiments, there are some related circuits outside the first profile 102 of the organic light emitting diode 101. When the orthogonal projection area of the second barrier layer 120 is larger than that of other barrier layers on the substrate 100, the second barrier layer 120 may protect the circuits. In other embodiments, the orthogonal projection area of the second barrier layer 120 may be smaller than that of other barrier layers on the substrate 100. However, the orthogonal projection area of the second barrier layer 120 must be larger than that of the organic light emitting diode 101 on the substrate 100 to protect the organic light emitting diode 101.

In some embodiments, the profile of the organic barrier layer which is most closed to the organic light emitting diode 101 is non-conformal with the first profile 102 of the organic light emitting diode 101, for example, the second profile 112 of the first barrier layer 110. The third profile 132 of the organic third barrier layer 130 on the first barrier layer 110 may be conformal or non-conformal with the first profile 102 of the organic light emitting diode 101. The profile of the inorganic barrier layer (the second barrier layer 120, the fourth barrier layer 140 or the fifth barrier layer 150) may be conformal or non-conformal with the first profile 102 of the organic light emitting diode 101. However, the upper barrier layer must cover the lower barrier layer and the organic light emitting diode 101.

To sum up, the profile of at least one barrier layer on the organic light emitting diode 101 is non-conformal with the organic light emitting diode 101. For example, the first profile 102 is non-conformal with the second profile 112 and/or the third profile 132. Thus, the organic light emitting diode 101 can be covered completely and the size of the organic light emitting diode display 10 can be shrunk.

It should be understood that the applications of the organic light emitting diode display 10 above are merely examples but not to limit this disclosure. The person with ordinary knowledge in this art may apply this disclosure to other applications of the organic light emitting diode display 10 as required.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An organic light emitting diode display, comprising:
    a substrate;
    an organic light emitting diode disposed on the substrate, wherein an orthogonal projection of the organic light emitting diode on the substrate has a first profile; and
    a first barrier layer disposed on the organic light emitting diode, wherein an orthogonal projection area of the first barrier layer is larger than that of the organic light emitting diode on the substrate, and wherein an orthogonal projection of the first barrier layer on the substrate has a second profile;
    wherein the first profile and the second profile are not conformal shape,
    wherein the first profile has a geometric center, and a distance between a first position of the second profile and the geometric center is minimum, wherein the line from the first position to the geometric center defines a first direction, and the line from a second position of the second profile to the geometric center defines a second direction, wherein the second direction and the first direction has an included angle,
    wherein when the included angle is about zero degree, the minimum distance between second position of the second profile and the first profile defines a relative minimum value,
    wherein when the included angle is about between zero degree to 45 degrees, the minimum distance between the second position of the second profile and the first profile substantially satisfies:

$d > d0 * \sec(\theta)$, in which d is the minimum distance between the second position of the second profile and the first profile, θ is the included angle, and d0 is the relative minimum value.

2. The organic light emitting diode display of claim 1, wherein when the included angle is about 90 degrees, the minimum distance between the second position of the second profile and the first profile is equal to the relative minimum value.

3. The organic light emitting diode display of claim 1, wherein when the included angle is about 45 degrees, the minimum distance between the second position of the second profile and the first profile is larger than the relative minimum value.

4. The organic light emitting diode display of claim 2, wherein when the included angle is about between 45 degrees to 90 degrees, the minimum distance between the second position of the second profile and the first profile substantially satisfies:

$d > d0 * \sec(90° - \theta)$, wherein d is the minimum distance between the second position of the second profile and the first profile, θ is the included angle, and d0 is the relative minimum value.

5. The organic light emitting diode display of claim 1, wherein the first barrier layer is made of an organic material.

6. The organic light emitting diode display of claim 1, further comprising:
    a second barrier layer disposed between the organic light emitting diode and the first barrier layer, wherein an orthogonal projection area of the second barrier layer is larger than that of the first barrier layer on the substrate.

7. The organic light emitting diode display of claim 6, wherein the orthogonal projection of the second barrier layer on the substrate has a profile, and the profile is not conformal with the first profile.

8. The organic light emitting diode display of claim 6, wherein the second barrier layer is made of an inorganic material.

9. The organic light emitting diode display of claim 1, further comprising:
    a third barrier layer disposed on the first barrier layer, wherein an orthogonal projection of the third barrier layer on the substrate has a third profile, and the third profile is not conformal with the first profile.

10. The organic light emitting diode display of claim 9, wherein the orthogonal projection area of the third barrier layer is larger than that of the first barrier layer on the substrate.

11. The organic light emitting diode display of claim 9, wherein the third barrier layer is made of an organic material.

12. The organic light emitting diode display of claim 9, further comprising:
    a fourth barrier layer disposed between the first barrier layer and the third barrier layer, wherein an orthogonal projection area of the fourth barrier layer is larger than that of the first barrier layer on the substrate.

13. The organic light emitting diode display of claim 12, wherein the fourth barrier layer is made of an inorganic material.

14. The organic light emitting diode display of claim 9, further comprising:
    a fifth barrier layer disposed on the third barrier layer, wherein an orthogonal projection area of the fifth barrier layer is larger than that of the third barrier layer on the substrate.

15. The organic light emitting diode display of claim 14, wherein the fifth barrier layer is made of an inorganic material.

16. The organic light emitting diode display of claim 9, further comprising:
    a second barrier layer disposed between the organic light emitting diode and the first barrier layer, wherein an orthogonal projection area of the second barrier layer is larger than that of the first barrier layer on the substrate.

17. The organic light emitting diode display of claim 16, wherein the second barrier layer is made of an inorganic material.

18. The organic light emitting diode display of claim 9, wherein the first profile is substantially a circle or similar to a circle.

* * * * *